(12) United States Patent
Esposito et al.

(10) Patent No.: US 7,288,972 B1
(45) Date of Patent: Oct. 30, 2007

(54) CIRCUITRY FOR SYNTHESIZING AN ARBITRARY CLOCK SIGNAL AND METHODS FOR THE SYNTHESIS THEREOF

(75) Inventors: Ben Esposito, Oviedo, FL (US); Mike Rothman, Jamaica Plain, MA (US)

(73) Assignee: Altera Corporation, San Jose, CA (US)

( * ) Notice: Subject to any disclaimer, the term of this patent is extended or adjusted under 35 U.S.C. 154(b) by 340 days.

(21) Appl. No.: 10/796,496

(22) Filed: Mar. 8, 2004

(51) Int. Cl.
*H03B 21/00* (2006.01)
(52) U.S. Cl. .................. 327/105; 327/107; 455/75
(58) Field of Classification Search .................. None
See application file for complete search history.

(56) References Cited

U.S. PATENT DOCUMENTS 6,653,957 B1 * 11/2003 Patterson et al. ........... 341/100
6,988,217 B1 * 1/2006 Madrid et al. .............. 713/500
2003/0031133 A1 * 2/2003 Momtaz ..................... 370/241
2003/0227906 A1 * 12/2003 Hallman ..................... 370/352
2005/0193290 A1 * 9/2005 Cho et al. ................... 714/710

* cited by examiner

*Primary Examiner*—Kenneth B. Wells
*Assistant Examiner*—An T. Luu
(74) *Attorney, Agent, or Firm*—Ropes & Gray LLP

(57) ABSTRACT

Circuitry for synthesizing an arbitrary clock signal with minimal jitter is provided. The circuitry of this invention selectively multiplexes a sequence of two different byte patterns into a serializer, which serializes the sequence and transmits it to receiver circuitry in the serial domain. The frequency of the synthesized clock transmitted by the serializer is a function of the serialized sequence and the frequency in which the serialized sequence is transmitted to the receiver circuitry. Thus, a desired clock frequency can be synthesized by manipulating the byte patterns and the sequence in which the bytes are serialized.

16 Claims, 6 Drawing Sheets

| ROW | SERIAL CLOCK (Hz) | DESIRED SYNTHESIZED CLOCK (Hz) | SERIAL CLOCKS PER SYNTHESIZED CLOCK | PATTERN A HIGH | PATTERN A LOW | PATTERN A EQUIVALENT FREQUENCY (Hz) | PATTERN B HIGH | PATTERN B LOW | PATTERN B EQUIVALENT FREQUENCY (Hz) | INSTANCES OF PATTERN A | INSTANCES OF PATTERN B | AVERAGE CLOCK RATE OVER TIME (Hz) | DIFFERENCE IN FREQUENCY (Hz) |
|---|---|---|---|---|---|---|---|---|---|---|---|---|---|
| 1 | 8.40E+08 | 2.62500E+07 | 32 | 16 | 0 | 5.25E+07 | 0 | 16 | 5.25E+07 | 1 | 1 | 2.6250000E+07 | 0 |
| 2 | 8.40E+08 | 5.4000E+07 | 15.55556 | 7 | 8 | 5.60E+07 | 8 | 8 | 5.25E+07 | 3 | 4 | 5.4000000E+07 | 0.00 |
| 3 | 8.40E+08 | 5.3930E+07 | 15.57575 | 7 | 8 | 5.60E+07 | 8 | 8 | 5.25E+07 | 20000 | 28951 | 5.3930001E+07 | -1.43 |
| 4 | 8.40E+08 | 5.3930E+07 | 15.57575 | 7 | 8 | 5.60E+07 | 8 | 11 | 5.25E+07 | 48095 | 69620 | 5.3930000E+07 | -0.42 |
| 5 | 8.40E+08 | 4.0456E+07 | 20.76354 | 10 | 10 | 4.20E+07 | 10 | 11 | 4.00E+07 | 10002 | 33912 | 4.0455527E+07 | 1.29 |
| 6 | 8.40E+08 | 3.9450E+07 | 21.29278 | 10 | 11 | 4.00E+07 | 11 | 11 | 3.82E+07 | 68000 | 29491 | 3.9450001E+07 | -0.51 |
| 7 | 8.40E+08 | 5.3900E+07 | 15.58442 | 7 | 8 | 5.60E+07 | 8 | 8 | 5.25E+07 | 2 | 3 | 5.3900000E+07 | 0.00 |

CIRCUITRY FOR SYNTHESIZING AN ARBITRARY CLOCK SIGNAL AND METHODS FOR THE SYNTHESIS THEREOF

BACKGROUND OF THE INVENTION

This invention relates to the synthesis of clock signals for use in programmable logic devices.

Typically, in a programmable logic device (PLD), several different clock signals are required to sustain operation of the PLD. For example, in high speed serial interface (HSSI) or high speed serial communications (HSSC) applications, the clocking frequency of the transmitted serial data may be too fast for a PLD to perform meaningful operations on the serial data. Therefore, the PLD may utilize slower clocking frequencies to enable the PLD to process the data.

Clock signals can be generated using phase-locked loops (PLLs) and numerically controlled oscillators (NCOs). Because PLLs are implemented on dedicated circuitry, the number of PLLs that can be implemented on the PLD is limited. This limitation may prevent a PLD from generating a requisite number of clocks that may be needed. Another drawback of PLLs is that they can only generate a finite number of clock frequencies because they are limited by the multiply/divide ratio supported by the PLL circuitry.

NCOs are an alternative approach to using PLLs to generate a clock. In general, a NCO generates a sinusoidal waveform in which the most significant bit of the waveform is used as the clock signal. NCOs are created using available logic resources, not dedicated circuitry. Using logic resources, as opposed to dedicated circuitry, provides as many clocks that can be generated based on the available logic resources. However, using logic resources to generate clocks may be problematic because those resources cannot be used elsewhere.

Another drawback of NCOs is that they introduce jitter into the clock signal they produce. Jitter is dependant on the clocking frequency of the clock signal produced by the NCO. More particularly, jitter is inversely proportional to the clock frequency generated by the NCO. Problems with jitter are further exacerbated by the fact that the maximum clocking frequencies used by PLDs is limited to a few hundred megahertz. For example, a NCO generating a clock frequency of 200 MHz introduces about +/−5 nanoseconds of jitter, which is problematic for many systems. Note that PLDs typically do not operate at higher speeds (e.g., clock frequencies on the order of a gigahertz) because of physical limitations in processing data at such higher speeds.

Therefore, in view of the foregoing, it is an object of this invention to provide circuitry that synthesizes a clock signal of a desired frequency with minimal jitter.

SUMMARY OF THE INVENTION

In accordance with the principles of the present invention, circuitry is provided to synthesize a clock signal of a particular frequency that has minimal jitter. The circuitry can generate more clock frequencies than a PLL and with less jitter than a similar clock generated by a NCO.

Circuitry of the invention synthesizes an arbitrary clock signal by selectively multiplexing a sequence of two different byte patterns (e.g., a predetermined arrangement of bits) into a serializer. For example, the sequence may be 110011001100, where "11" is one of the byte patterns and "00" is the other byte pattern. The serializer serializes the sequence and transmits it in the serial domain to receiver circuitry.

An advantage of the circuitry of the invention is that the synthesized clock frequency is a function of the serialized sequence and serial clocking frequency. Thus, a desired clock frequency can be synthesized by manipulating the byte patterns and the sequence in which bytes are serialized. This provides much more flexibility in synthesizing clock frequencies than PLLs.

Another advantage realized by the circuitry of the invention is that the jitter associated with synthesized clock is minimal. Jitter is minimal because the clock signal is transmitted in the serial domain.

A further advantage of the circuitry of the invention is that the synthesis of desired clock signals can be performed on the transmission side of HSSI, HSSC, or other high speed serial transmission system. This reduces the amount of hardware (e.g., PLLs) needed by receiver circuitry to provide particular clocking frequencies. Furthermore, the transmission side can transmit as many synthesized clocks as needed, given that there is adequate circuitry to synthesize the required number of clocks.

Further features of the invention, its nature and various advantages will be more apparent from the accompanying drawings on the following detailed descriptions.

BRIEF DESCRIPTION OF THE DRAWING

FIG. 4 is a table of illustrative synthesized clocking frequencies that can be generated using the circuitry in accordance with the invention.

DETAILED DESCRIPTION

Figure 1:
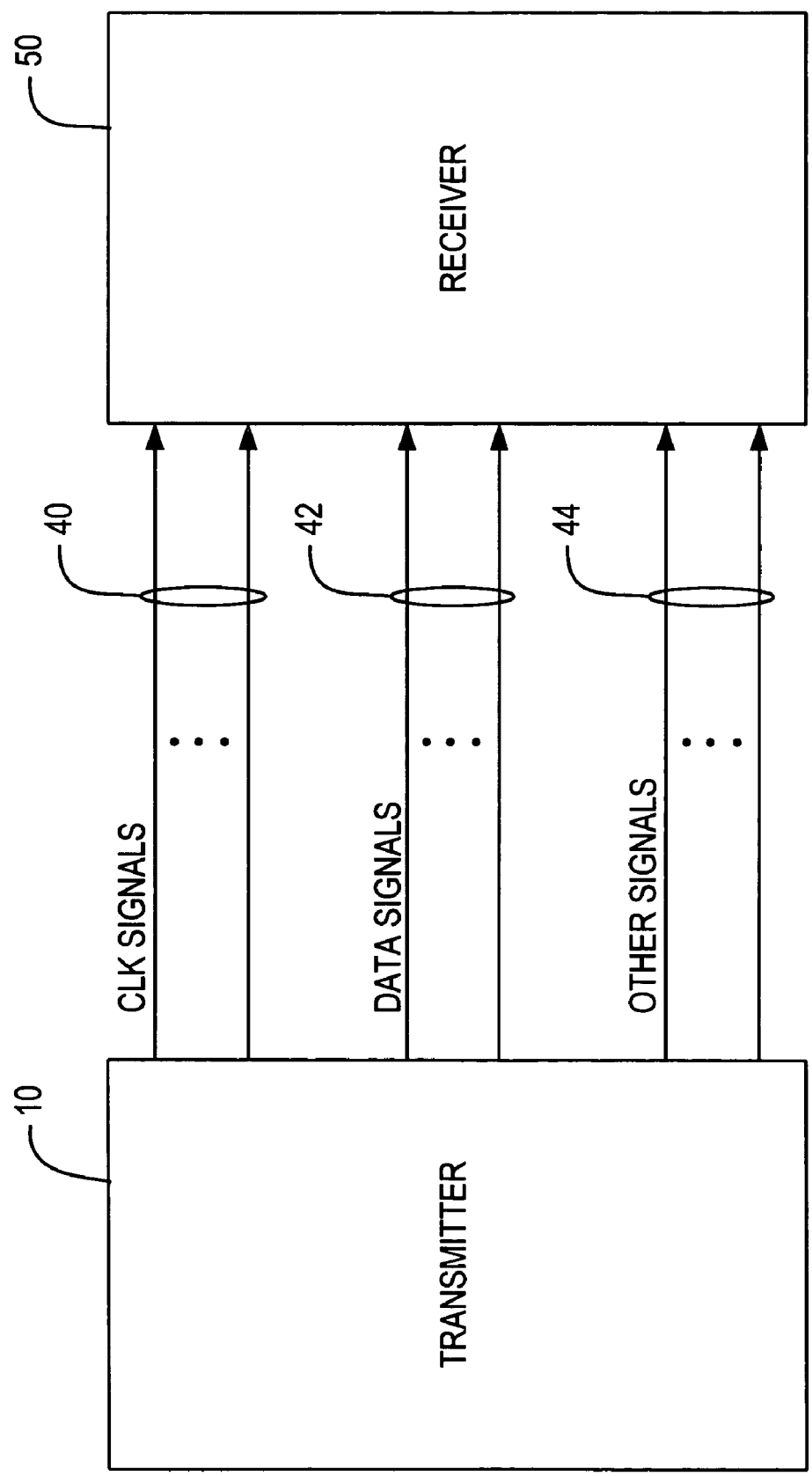
FIG. 1 is a simplified schematic block diagram of an illustrative embodiment of the circuitry in accordance with the invention.

The illustrative embodiment shown in FIG. 1 is in the context of PLD circuitry used in transmitting signals from transmitter circuitry 10 to receiver circuitry 50 over a transmission medium. Receiver circuitry 50 is typically coupled to PLD core circuitry (not shown), which utilizes the signals transmitted by transmitter circuitry 10. The combination of the PLD core circuitry and receiver circuitry 50 is sometimes collectively referred to as PLD circuitry that is typically (although, not necessarily) a single integrated circuit.

In accordance with this invention, transmitter circuitry 10 transmits signals serially to receiver circuitry 50. Note that serial transmission of data, or signal, is sometimes referred to herein as transmission in the serial domain. Transmitter circuitry 10 may be used as part of a HSSI or other high speed serial communication application. HSSI is a transmission standard that transmits data serially at clocking frequencies approaching or exceeding 1 gigahertz, with clocking frequencies increasing with each advancement of technology. Note that the invention is not limited solely to high speed serial transmission applications, but can also be applied to slower speed serial transmission applications.

The signals transmitted by circuitry 10 includes clock signals 40, data signals 42, and other signals 44. Several clock signals are shown to illustrate that circuitry 10 can transmit a multitude of clock signals. In accordance with this invention, each clock signal may represent a specific synthesized clock frequency. In addition, circuitry 10 can transmit one or more data signals. If desired, a multitude of other signals 44 may be transmitted by circuitry 10.

If desired, a data signal may correspond to a particular clock signal. That is, both the clock signal and the data signal are transmitted serially to receiver circuitry 50 at the same serial transmission rate, but the clock signal indicates the clock frequency at which the data signal is to be processed. For example, a clock signal may be used as a reference clock in receiver circuitry 50 for processing the data. A reference clock may be needed to deskew or adjust the phase of the serially transmitted data.

Figure 2:
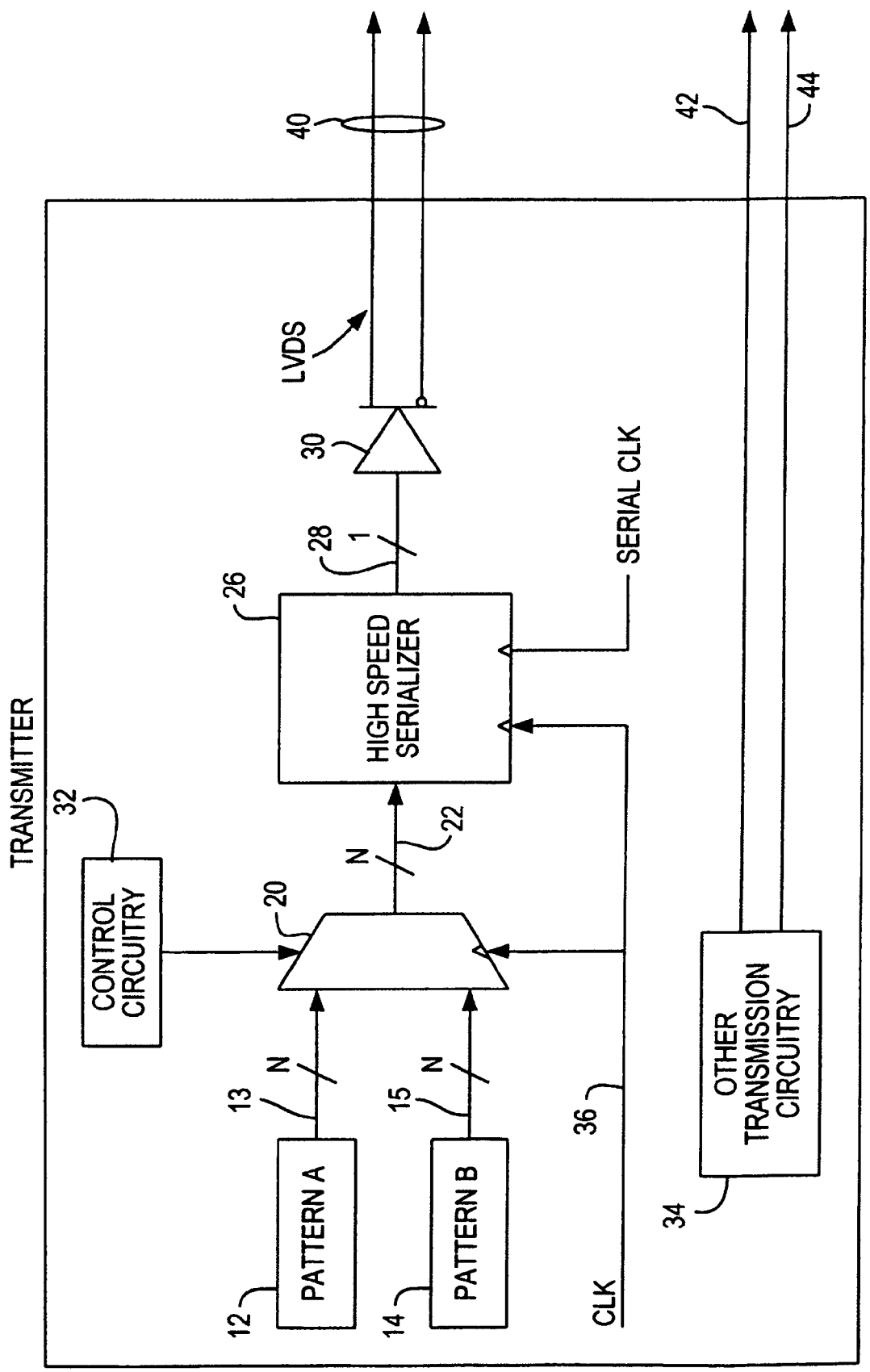
FIG. 2 is a simplified schematic block diagram of an illustrative embodiment of a transmission aspect of the circuitry in accordance with the invention.

FIG. 2 shows an illustrative schematic diagram of transmitter circuitry 10 used for synthesizing a clock signal in accordance with the present invention. Circuitry 10 synthesizes an arbitrary clock signal by selectively multiplexing a sequence of two different byte patterns and serializing that sequence prior to transmitting the sequence to receiver circuitry.

The byte patterns (shown as pattern A and pattern B) are stored in memory 12 and memory 14. Memory 12 and 14 may be random-access-memory or read-only-memory. The particular type of memory utilized is not critical for operation of the invention. It will be appreciated that the invention is not limited to using only memory to store patterns. Other devices or methods can be used.

The patterns stored in memory 12 and 14 may include a predetermined string of bits having logic HIGH bits, logic LOW bits, or a combination of logic HIGH and LOW bits. The stored byte patterns are different and may or may not be the same length. For example, one pattern (e.g., Pattern A) may have seven HIGH bits followed by eight LOW bits and the other pattern (e.g., Pattern B) may have eight HIGH bits followed by eight LOW bits. The arrangement of byte patterns is discussed below in more detail in connection with FIGS. 4 and 5.

FIG. 2 shows that patterns A and B are transmitted to multiplexer 20 in parallel on leads 13 and 15, respectively. Multiplexer 20 selects which pattern is transmitted to high speed serializer 26 on leads 22. Multiplexer 20 may be controlled by control circuitry 32, which may be programmed to select a particular sequence of patterns. For example, controller 32 may instruct multiplexer 20 to select sequence ABABAB (where A and B are byte patterns A and B, respectively). Thus during a first clock cycle (note clock 36) multiplexer 20 selects pattern A. In the next clock cycle, multiplexer 20 selects pattern B. This sequence may repeat indefinitely so that a particular synthesized clock signal is continuously transmitted to receiver circuitry 50.

High speed serializer 26 receives selected pattern in a parallel each clock cycle. Serializer 26 converts the byte pattern into a serial stream of bits by clocking each bit of the pattern according to a serial clocking frequency to lead 28. Thus, the sequence of selected patterns becomes a serial sequence of bits that are transmitted to receiver circuitry 50 in the serial domain. If desired, the serialized sequence on lead 28 can be converted into a differential signal by differential circuitry 30 before it is transmitted to receiver circuitry 50. Differential circuitry 30 may, for example, convert the serialized sequence into a low voltage differential signal or other type of high speed differential signal (e.g., LVDTS). The serialized differential signal is shown being transmitted on leads 40 in FIG. 2.

To further illustrate how the circuitry of this invention synthesizes a particular clock frequency, consider the following example. Assume that pattern A is "1111" and pattern B is "0000". If the multiplexer selects the combination ABAB, the serialized result is "1111100001110000." If the multiplexer selects the combination AABB then the serialized result is "1111111100000000." By way of example, this shows that the frequency of the AABB sequence is one-half the frequency of the ABAB sequence. Note that the actual synthesized frequency is a function of the serialized sequence and the clocking frequency of the serial domain. Thus, by manipulating the byte patterns and the sequence, it can be seen that a desired clocking frequency can be synthesized.

Transmitting the synthesized clock signal in the serial domain mitigates the deleterious affects of jitter. This is because jitter is inversely proportional to transmission frequency. Therefore, the faster the transmission frequency, the less the jitter. For example, if the serial transmission frequency is 840 MHz, this corresponds to a jitter of +/−1.9 ns.

FIG. 2 also illustrates that other transmission circuitry 34 may be used to transmit, for example, data on leads 42 and other signals such as reset or enable bits on leads 44. Note that the discussion of circuitry other than circuitry used to synthesize clocks in accordance with the invention is not intended to be a detailed discussion. Rather, this other circuitry is briefly mentioned to indicate that such other circuitry may be included in transmission circuitry 10.

The serialized sequence may be routed to other circuitry within transmission circuitry 10, in addition to being transmitted to receiver circuitry 50. For example, serialized sequence may be used to synchronize transmission of data on leads 42.

Note that circuitry shown in FIG. 2 merely represents the circuitry needed to synthesize one clock signal. It is understood that additional circuitry may be included in transmission circuitry 10 to generate the requisite number of clocks. For example, there may be extra memory to store byte patterns, a multiplexer, and a high speed serializer for each additional clock. Moreover, it will be understood that the byte patterns and/or the sequence of byte patterns may be specifically configured to synthesize the desired clock frequency.

Figure 3:
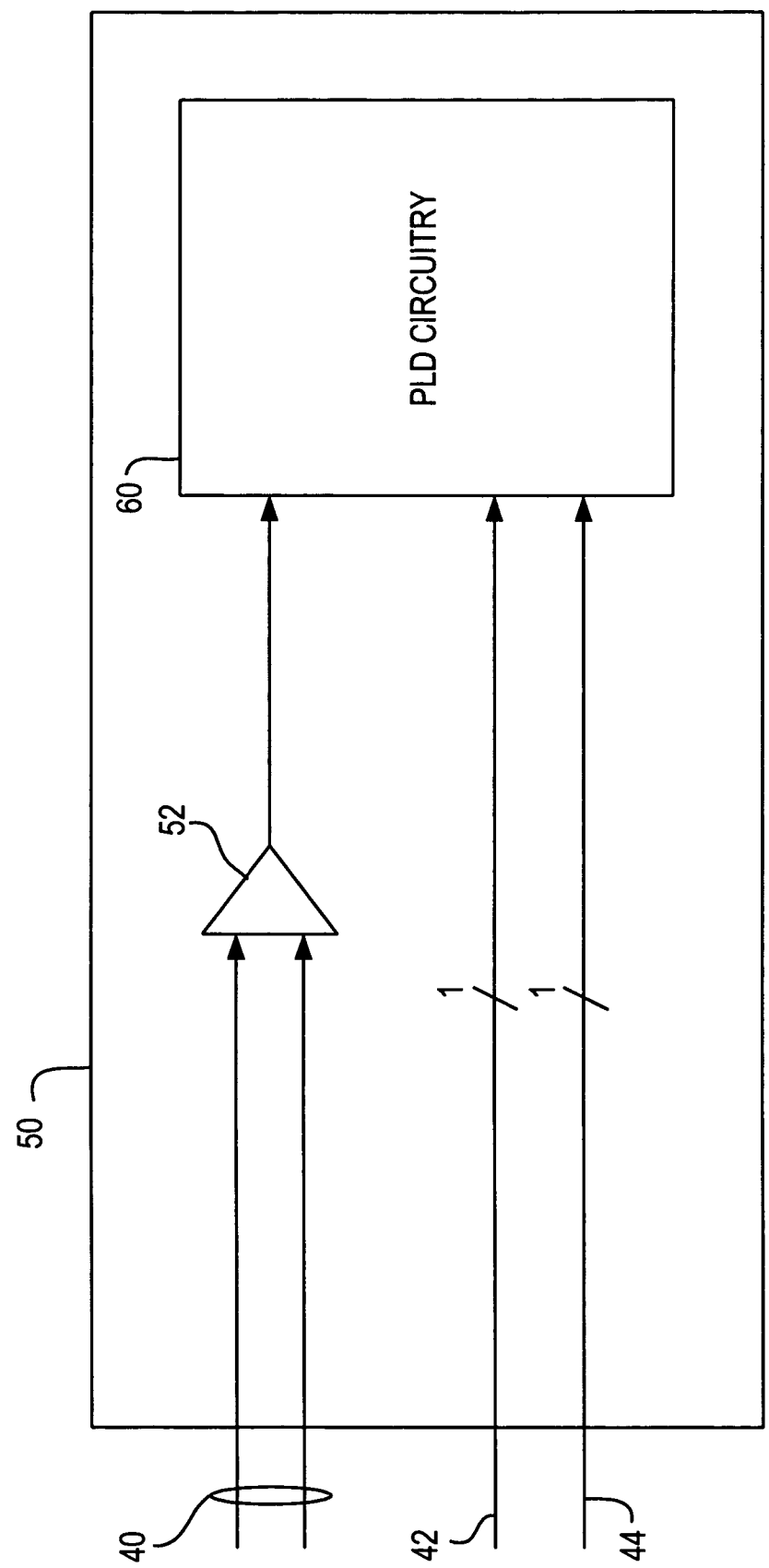
FIG. 3 is a simplified schematic block diagram of an illustrative embodiment of a receiver aspect of the circuitry in accordance with the invention.

FIG. 3 shows an illustrative schematic of receiver circuitry 50 in accordance with the invention. As described above in connection with FIG. 1, receiver circuitry 50 receives serially transmitted signals (e.g., data and clock signals) from transmission circuitry 10. FIG. 3 shows clock signals being received on leads 40, data signals on leads 42, and other signals on leads 44. The signals on lead 40 may be routed to differential circuitry 52 prior to being routed to PLD circuitry 60. The signals on leads 42 and 44 may be received directly by PLD circuitry 60, or may be routed to other circuitry within receiver 50. Note that, in general, PLD circuitry 60 is circuitry that utilizes signals received by receiver circuitry 50. Note that the transmitter shown in FIG. 2 and the receiver shown in FIG. 4 may reside within the same PLD or separate PLDs.

One advantage of receiver circuitry 50 receiving a synthesized clock, even though the signal is transmitted in the serial domain, is that it eliminates the need for high speed deserializer circuitry to process clock data. Differential circuitry 52 may extract the synthesized clock signal from the serialized signal by detecting transitions (e.g., 1 to 0 or 0 to 1 transitions) in the received differential signal and transmit the clock signal to PLD circuitry. Thus, the string of ones and zeros between each transition represents the frequency of the clock. Circuitry 52 may, for example, include a latch for detecting transitions and a flip-flop for outputting the synthesized clock signal at the desired frequency. Thus, even though the serialized differential signal is being received in the serial domain, the output of circuitry 52 delineates the synthesized clock. Hence, there is no need to deserialize the clock signal to ascertain the clocking frequency being transmitted by transmitter circuitry 10.

The output of circuitry 52 may be provided to PLD circuitry 60 for the desired utilization. For example, the synthesized clocks may be used as reference clocks. Multiple instances of circuitry 52 may be included in circuitry 50 so that multiple synthesized clock signals can be received and processed. For example, if transmitter circuitry 10 is transmitting ten separate serialized clock sequences, receiver circuitry preferable has circuitry to receive at least 10 serialized sequences.

The foregoing demonstrates an illustrative circuit embodiment for synthesizing an arbitrary clock signal that is transmitted to receiver circuitry 50 in the serial domain. The following discusses how arbitrary clock signals are synthesized using circuitry of the invention.

To generate a particular clock signal, several factors are taken into account. The factors include the serial clocking frequency, the desired clocking frequency, the two byte patterns, and the sequence of the byte patterns. Typically, however, the serial clocking frequency and the desired clocking frequency are used as a starting point in determining the other factors. Using the serial clock and the desired clock, the byte patterns can be calculated. Once the byte patterns are known, more calculations may be performed to determine how many instances of each byte pattern are needed to synthesize the desired clock frequency. For example, three instances of pattern A and four instances of pattern B may be needed to synthesize an average clock frequency that is equal to or substantially equal to the desired clocking frequency. Finally, the instances of each byte pattern are arranged in a sequence that instructs the multiplexer which byte patterns to select for serialization. Once the sequence is determined, it may be stored, for example, in control circuitry 32.

Figure 5:
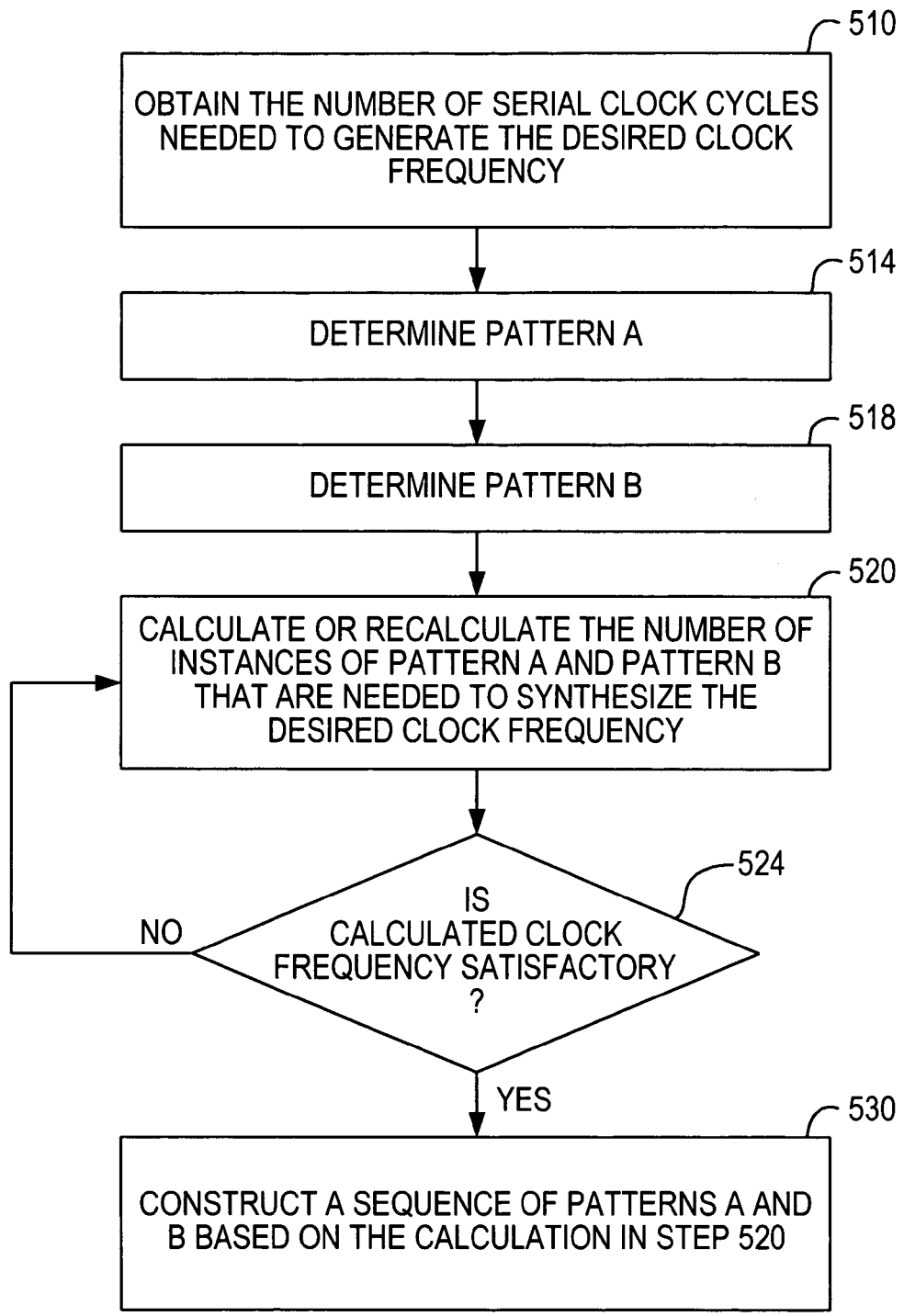
FIG. 5 is a flowchart that illustrates the steps in constructing a sequence of byte patterns that need to be serialized in order to synthesize a clock signal in accordance with the invention.

In fact, it may be desirable to program the circuitry of the invention with predetermined sequences so that the desired synthesized frequencies can be transmitted to receiver circuitry 50. That is, if a user wishes to synthesize, for example, twenty different clocks, twenty different sequences may be needed to synthesize each clock. FIGS. 4 and 5, below, illustrate an example of steps that may be taken to determine a sequence for synthesizing a particular clock frequency. FIG. 4 shows several examples of clocks that can be synthesized in accordance with the present invention. FIG. 5 shows a flowchart that illustrates the steps in constructing a sequence of byte patterns that need to be serialized in order to synthesize a clock signal in accordance with the invention.

FIG. 4 shows several synthesized clocks having average clocking frequencies that are equal to or substantially equal to a desired synthesized clocking frequency. FIG. 4 also shows the serial clock frequency of each synthesized clock, the number of serial clock cycles needed to generate the desired clock frequency, patterns A and B, the clock frequency generated by patterns A and B, the instances of each pattern A and B needed to synthesize the desired clock, and the difference between the actual synthesized frequency and the desired synthesized frequency.

Beginning with step 510, the number of serial clock cycles needed to generate the desired clock frequency is obtained by dividing the serial clock frequency by the desired synthesized clock frequency. For convenience, this value is referred to herein as the per cycle value. For example, if the serial clocking frequency is 840 MHz and the desired clocking frequency 26.25 MHz, the per cycle value is 32.

The per cycle value can be used to determine byte patterns A and B (e.g., number of high bits and low bits for each pattern), shown as steps 514 and 518 of FIG. 5. Using the per cycle value, the two nearest integer clock rates are selected. By way of example, if the per cycle value is an integer such as 32, the two nearest integer clock rates are both 16, as shown in row 1 of FIG. 4. As also shown, the equivalent frequency for integer clock rates of 16 is 52.5 Mhz. If by way of another example the per clock value is irrational such as 15.55556, the two nearest integer clock rates are 15 and 16, as shown in row 2 of FIG. 4. The equivalent frequency of a clock rate of 15 is 56 Mhz.

Once the integer clock rates are selected, the arrangement of each byte pattern (e.g., number of high and low bits) is chosen to approximate or equal a 50% duty cycle. For example, referring to row 2 of FIG. 4, pattern A has seven high bits and eight low bits, which corresponds to the integer value of 15, and pattern B has eight high and low bits, which corresponds to the integer value 16.

After patterns A and B have been determined, the process proceeds to step 520 to calculate the number of instances of patterns A and B needed to synthesize the desired clocking frequency and keep the clock jitter to +/−1 period of the high speed serial clock. This calculation yields the number of patterns A and B that need to be serialized in order to create an average clock frequency that is equal to or substantially equal to the desired synthesized clock frequency. Referring to row 1 of FIG. 4, only one instance of each pattern A and B is needed to produce an average synthesized clock of 26.25 MHz. Referring to row 2, three instances of patterns A and four instances of pattern B are needed to generate an average synthesized clock of 54 MHz.

At step 524, if the calculation produced at step 520 does not yield an average synthesized clock frequency that satisfies a predetermined tolerance (e.g., jitter) the process may loop back to step 520. If the process loops back to step 520, another calculation may be performed to obtain an average clocking frequency that meets the predetermined tolerance criteria. Note that by recalculating the number of instances of patterns A and B, the process can "dial-in" the average clocking frequency to a desired tolerance. This can be seen in FIG. 4 where a clock frequency of 53.93 MHz is desired. Particularly, it is seen in row 3 that the average clocking frequency varied from the desired clock frequency by 1.42 Hz, whereas in row 4, the average clocking frequency varied from the desired clocking frequency by only 0.42 Hz. Thus the number of instances of pattern A relative to pattern B may determine the accuracy of the synthesized clock.

If the average clock frequency meets the tolerance criteria set forth at step 524, the process proceeds to step 530. At step 530, the calculated number of instances of pattern A and pattern B is used to construct a sequence of patterns that need to be multiplexed into the serializer to synthesize the desired clocking frequency. Referring to FIG. 4, it is understood that synthesizing a clock frequency of 26.25 MHz entails alternating patterns A and pattern B (e.g., AB). This case is straight forward because the sequence has an equal number of instances of each pattern. However, when the instances of each pattern differ, the sequence requires a more elaborate construction.

Consider, for example, row 2 of FIG. 4 where a clock of 54 MHz is desired. Here, three instances of pattern A are needed for four instances of pattern B, resulting in one extra occurrence of pattern B. This extra instance of pattern B needs to be distributed across three instances of pattern A so that the average clocking frequency approximates the desired clocking frequency. This is accomplished by alternating patterns A and B three times followed by one instance of pattern B (e.g., ABABABB). This concept of distributing excess instances of patterns across a finite number of instances of another pattern follows for any sequence having an unequal number of instances of patterns.

For example, to construct a sequence for the desired synthesized clock in row 3, 8951 additional instances of pattern B need to be distributed over 20000 alternating sequences of pattern A followed by pattern B (e.g., 20000 AB sequences). Since it is known that 8951 instances of pattern B need to distributed across 20000 AB sequences, a determination is made to calculate when each addition sequence B should be injected into the 20000 AB sequences. This determination is made by dividing the 20000 AB sequences by the 8951 additional instance of B, which yields 2.234. This indicates that an extra pattern B needs to be injected for every 2.234 AB sequences. Because 2.234 is not an integer, further calculations are required to determine when to inject additional instances of pattern B. This is done by creating higher order sequences, which provide a framework for incorporating extra B patterns into the 20000 AB sequences.

The following example shows how higher order sequences are used. To begin, a first sequence is created based on the integer component of 2.234 (i.e., 2). This sequence, labeled X, includes two sequences of A and B followed by one instance of B (i.e., ABABB). Another sequence is created using an integer equal to the sum of the above mentioned integer component and one (e.g., in this example three). This sequence, labeled Y, includes three sequences of A and B followed by one instance of B (i.e., ABABABB). The higher order sequence is the combination of X and Y (i.e., XY), the combination of which yields 7 instances of B for each 5 instances of A.

The XY sequence yields 28,000 instances of B for 20,000 instances of A. This is realized by dividing 20,000 instances of A needed to generate the desired clock signal by 5 (instances of A in Sequence XY), which provides 4,000. This 4,000 is then multiplied by the number of instances of B in sequence XY (7) to yield 28,000. Comparing this result to the required instances of B, 951 additional instances of B are still required.

Using the technique similar to that described above, an additional higher order sequence is created to determine how the remaining 951 instances of pattern B are to be distributed across 4,000 XY sequences. To make this determination the 4,000 XY sequences are divided by 951 to yield ~4.2. This 4.2 is rounded up to 5, which is used for the higher order sequence, labeled Z. Z has 5 instances of XY followed by one instance of B. This results in 36 instances of B for each 25 instances of A or 28,800 instances of B for 20,000 instances of A. Note that 151 additional instances of pattern B still need to be distributed across 800 Z sequences. To determine the length of the next high order sequence, 800 is divided by 151 (the number of additional instances of pattern B required) to yield ~5.9, which is then rounded up to 6. Assume that higher order S has 6 instances of Z followed by an extra B. This S sequence has 217 instances of B for every 150 instances of A, yielding 28,933 instances of B for 20,000 instances of A. Note that only 18 (28,952-28,933) additional instances of B are now required. The above process can be repeated one more time to eliminate the additional instances of B resulting in a total of 28951 instances of B for every 20,000 instances of A.

It is understood that the foregoing example that shows how the 20,000 instances of A and 28,951 instances of B can be distributed is merely illustrative. Any other method may be implemented to determine how such instances of patterns A and B are distributed.

Persons skilled in the art will appreciate that computer programs can be implemented to generate tables or spreadsheets to show which arrangement of byte patterns and sequences need to be programmed into the circuitry of the invention to generate a particular clock frequency, based on a particular serial clocking frequency. In one approach, such a program can reside in circuitry of the invention such as transmission circuitry 10 of FIG. 1. Using this approach, a user may interact with the program by inputting desired clock frequencies. Once the desired clock frequencies are entered, the program may load the appropriate byte patterns and sequences as appropriate. In another approach, a manufacturer may configure the circuitry of the invention to synthesize various clock frequencies desired by a customer.

Figure 6:
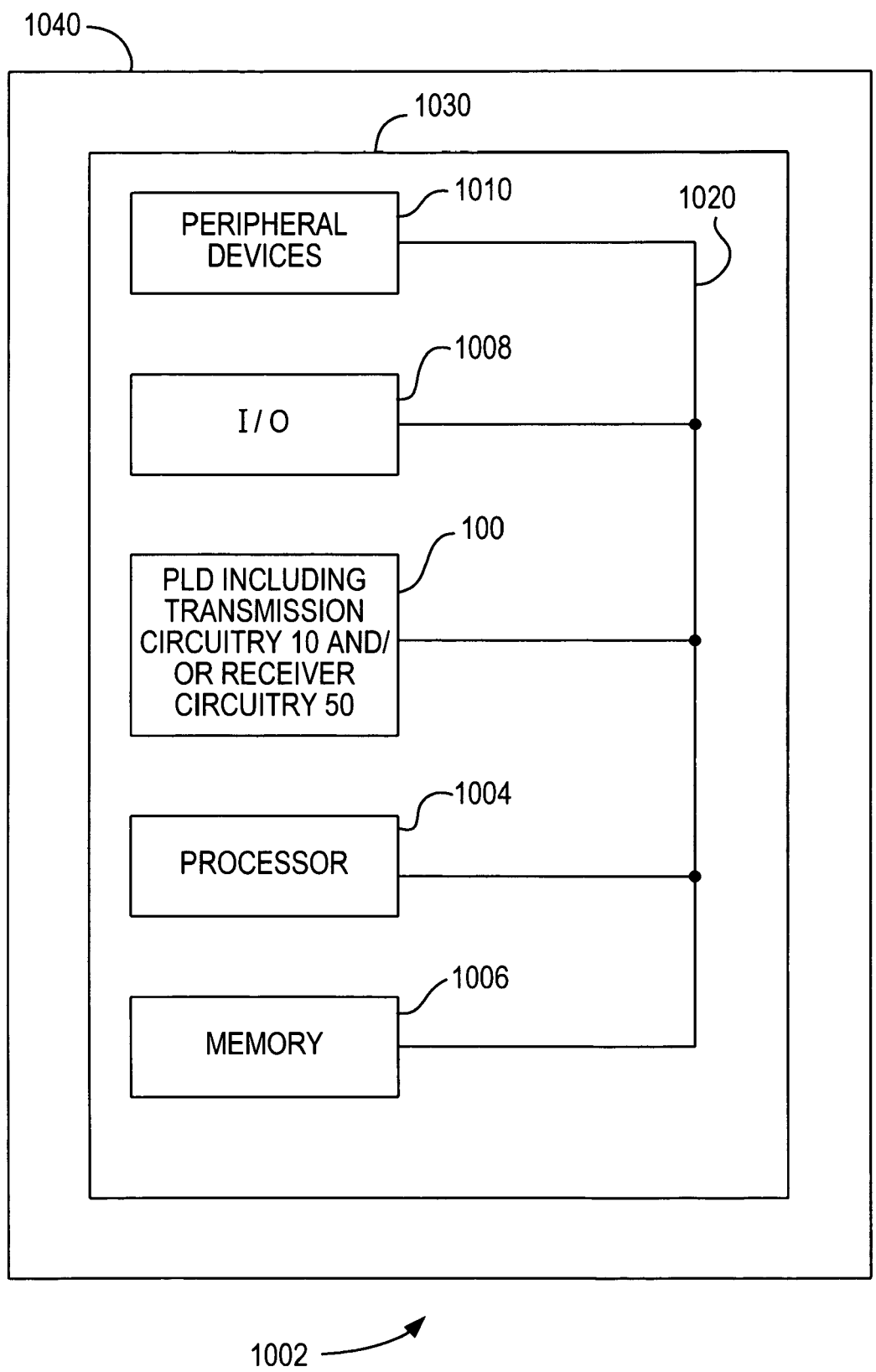
FIG. 6 is a simplified block diagram of an illustrative system employing circuitry in accordance with the invention.

FIG. 6 illustrates clock synthesizing circuitry 100 in accordance with this invention in a data processing system 1002. Circuitry 100 may be a PLD that includes transmission circuitry 10 and/or receiver circuitry 50. Data processing system 1002 may include one or more of the following components: a processor 1004; memory 1006; I/O circuitry 1008; and peripheral devices 1010. These components are coupled together by a system bus or other interconnections 1020 (which may include HSS connections) and are populated on a circuit board 1030 that is contained in an end-user system 1040.

System 1002 can be used in a wide variety of applications, such as computer networking, data networking, instrumentation, video processing, digital signal processing, or any other application. Circuitry 100 may be used to perform a variety of different logic functions. For example, circuitry 100 may be configured as a processor or controller that works in cooperation with processor 1004. Circuitry 100 may also be used as an arbiter for arbitrating access to a shared resource in system 1002. In yet another example, circuitry 100 can be configured as an interface between processor 1004 and one of the other components in system 1002. It should be noted that system 1002 is only exemplary, and that the true scope and spirit of the invention should be indicated by the following claims.

Various technologies can be used to implement PLDs (like the circuitry 100 in FIG. 6 and the circuitry shown in the other FIGS.). For example, the technology used can be based on EPROMs, EEPROMs, pass transistors, transmission gates, antifuses, laser fuses, metal optional links, mask programmability, function control registers (e.g., as in Wahlstrom U.S. Pat. No. 3,473,160), etc. From the various examples mentioned above it will be seen that this invention is applicable to both one-time-only programmable and reprogrammable devices.

It will be understood that the forgoing is only illustrative of the principles of the invention and that various modifications can be made by those of skill in the art without departing from the scope and spirit of the inventions.

What is claimed is:

1. A high speed serial communication system, comprising:
   transmission circuitry that synthesizes a first clock signal having any one of a plurality of predetermined frequencies by serializing a first predetermined sequence of first and second byte patterns, wherein said circuitry receives the contents of said first and second byte patterns in parallel, the serialization of which generates a serialized sequence that is transmitted to receiver circuitry at a serial clocking frequency, said predetermined frequency of said clock signal being a function of said serial clocking frequency and said serialized sequence; and
   wherein said transmission circuitry synthesizes a second clock signal having a second predetermined frequency by serializing a second predetermined sequence of third and fourth byte patterns.

2. The system of claim 1, wherein said receiver circuitry receives said serialized sequence at said serial clocking frequency and derives said first clock signal by monitoring said serialized sequence for bit transitions, wherein the string of logic HIGH and LOW bits occurring between said transitions represent said predetermined frequency of said first clock signal.

3. The system of claim 1, wherein said transmission circuitry comprises:
   memory that stores said first and second byte patterns;
   multiplexer circuitry that selects which one of said first and second byte patterns are to be serialized; and
   serializer circuitry that serializes the byte patterns selected by said multiplexer circuitry.

4. The system of claim 3, wherein said transmission circuitry further comprises:
   controller circuitry having stored therein said first predetermined sequence for instructing said multiplexer circuitry to select said first and second byte patterns according to said first predetermined sequence.

5. The system of claim 1, wherein said first and second byte patterns comprise bits selected from the group consisting of logic LOW bits, logic HIGH bits, and a combination of logic LOW and HIGH bits.

6. The system of claim 5, wherein the bit arrangement of said first and second byte patterns are selected based on said predetermined frequency of said first clock signal.

7. The system of claim 1, wherein said serialized sequence is transmitted to said receiver circuitry as a differential signal.

8. The system of claim 1, wherein said predetermined frequency is a frequency existing at or below said serial clocking frequency.

9. The system of claim 1, wherein said first and second byte patterns are different than said third and fourth byte patterns.

10. A method for synthesizing a clock signal of a predetermined frequency, comprising:
    providing a serial clocking frequency;
    providing a first byte pattern and a second byte pattern, wherein the contents of said first and second byte patterns are received in parallel;
    selecting a predetermined sequence of said first and second byte patterns, wherein said sequence comprises a predetermined number of said first byte pattern and a predetermined number of said second byte pattern; and
    serializing said predetermined sequence according to said serial clocking frequency to generate a serialized sequence, said predetermined frequency being a function of said serialized sequence and said serialized clock signal.

11. The method of claim 10, wherein said first and second byte patterns comprise bits selected from the group consisting of logic LOW bits, logic HIGH bits, and a combination of logic LOW and HIGH bits.

12. The method of claim 10, further comprising transmitting said serialized sequence to receiver circuitry.

13. The method of claim 12, wherein said serialized sequence is transmitted as a differential signal.

14. The method of claim 10, wherein said predetermined frequency is a frequency at or below said serial clocking frequency.

15. The method of claim 10, further comprising monitoring said serialized sequence for bit transitions, wherein said transitions represent said predetermined frequency.

16. The method of claim 10, further comprising:
    providing a third byte pattern and a fourth byte pattern;
    selecting a second sequence of said third and fourth byte patterns;
    serializing said second sequence according to said serial clocking frequency to generate a second serialized sequence, said second predetermined frequency being a function of said second serialized sequence and said serialized clock signal.

* * * * *